United States Patent [19]
Liang et al.

[11] Patent Number: 4,742,491
[45] Date of Patent: May 3, 1988

[54] MEMORY CELL HAVING HOT-HOLE INJECTION ERASE MODE

[75] Inventors: Mong-Song Liang, Milpitas; Tien-Chiun Lee, Sunnyvale, both of Calif.

[73] Assignee: Advanced Micro Devices, Inc., Sunnyvale, Calif.

[21] Appl. No.: 780,482

[22] Filed: Sep. 26, 1985

[51] Int. Cl.[4] .............................................. G11C 7/00
[52] U.S. Cl. .................... 365/218; 365/104; 365/185
[58] Field of Search ................ 365/182, 185, 218; 357/23.5

[56] References Cited

U.S. PATENT DOCUMENTS 4,503,519 3/1985 Arakawa ................. 365/185 X

OTHER PUBLICATIONS

Y. N. Hsieh et al., "Double Polysilicon Electrically Alterable Read-Only Storage Cell", IBM Technical Disclosure Bulletin, vol. 23, No. 1, Jun. 1980, pp. 227–228.

G. Yaron et al., "E$^2$FAMOS–An Electrically Eraseable Reprogrammable Charge Storage Device", IEEE Transactions on Electron Devices, vol. ED-26, No. 11, Nov. 1979, pp. 1754–1759.

Primary Examiner—Joseph A. Popek
Attorney, Agent, or Firm—Patrick T. King; Eugene H. Valet; Mark E. Miller

[57] ABSTRACT

A single component electrically erasable memory cell is disclosed. A floating gate MOSFET having a relatively short channel is triggered into a snap-back mode positive feedback biasing mechanism. Hot-hole injection onto the floating gate during the snap-back mode neutralizes any charge stored there to represent a data bit.

14 Claims, 5 Drawing Sheets

MEMORY CELL HAVING HOT-HOLE INJECTION ERASE MODE

BACKGROUND OF THE INVENTION

1. Field of the Invention

The present invention relates to programmable read only memory (PROM) integrated circuit devices and, in particular, to a single transistor cell structure for electrically erasable PROM integrated circuit devices and the method for performing erasure of data stored in such a cell.

2. Description of the Related Art

In current integrated circuit technology, there are two basic forms of erasable PROM (EPROM) devices: EPROMS on which the programmer uses impinging ultraviolet light (UV) to perform the erase function, and EEPROMS which use an electrical potential to perform erasure of the memory cells.

In each type of cell, data is represented by an electrical potential stored during the programming stage by charge injection upon a floating gate, i.e., a semiconductor region separated from the substrate and other layers in each cell by thin dielectric layers.

In the UV EPROM, the charge is removed when incident photons impart sufficient energy to stored electrons to excite them to a state where they can migrate off the gate. This requires the package to have a UV transparent window over the die, generally a quartz lid which is a high-cost item.

In an EEPROM, two general schemes exist for performing the erase function. One type of device makes use of reversible electron tunneling beneath the floating gate. By putting a relatively high potential on a superposing control gate which is opposite to the potential used during the programming mode, the stored charge is driven off the floating gate through a narrow tunnel oxide region separating the floating gate from the substrate. The other type is a triple polysilicon layer structure; the first layer provides a ground reference plate, the second is the floating gate, and the third is a program/erase control line. A second transistor, a select transistor, is used to select the bit for erasing and a voltage pulse is put on a bit line in order to draw the electrons off the floating gate. A typical circuit of the prior art for an EEPROM is shown in FIG. 1. Each of these devices exhibits inherent disadvantages.

As shown in FIG. 1(a), in both EEPROM devices, the dielectric layer, typically silicon dioxide, through which the electrons tunnel is relatively thin. A typical thin oxide in a tunneling structure may be only 110 Angstroms. The thin oxide facilitates the migration of the electrons at a low driving potential during erasure, generally about 25 volts. However, most devices have a normal operating electrical bias potential of only 5 volts or less. The relatively high voltage applied during the erase cycle results in a breakdown of these thin oxide layers. Degradation of the tunnel oxide induces leakages that affect the data retention capability of the cell. After approximately 10,000 erasures, an EEPROM is, in effect, worn out because of ultimate breakdown of the tunnel oxide.

Moreover, another disadvantage is that EEPROM devices require a "select" device to form the cell, i.e., two devices to store one bit of datum. This makes it hard to achieve high packing density desirable for small but powerful data processing machines.

In UV EPROM devices, erase time is dependent upon the erase rate factors, such as the UV spectral density and intensity, and the threshold voltage set by the sense amplifier used in conjunction with the EPROM cell array. FIG. 2 depicts the carrier action during an ERASE mode. In general, the erase process is slow, requiring minutes in a system generally operating in the nanoseconds realm.

SUMMARY OF THE INVENTION

It is an object of the present invention to provide an EEPROM cell which is amenable to high packing density on an integrated circuit chip.

It is another object of the present invention to provide an EEPROM cell which can be erased by hot-hole injection onto the floating gate region of the cell structure.

It is a further object of the present invention to provide a method of erasing an EEPROM cell.

It is yet another object of the present invention to provide a rapid, nondestructive method for erasing an EEPROM cell.

In its broad aspect, the present invention is a single floating gate transistor which is capable of being biased in a relatively nondestructive snap-back mode. Such biasing results in erasure of any charge, representing a data bit, stored on the floating gate. In another broad aspect, the invention presents a method of erasing a single floating gate semiconductor memory device by hot-hole injection onto the floating gate.

An advantage of the present invention is that the cell comprises only a single transistor, viz., the elimination of a select transistor and, hence, the saving of approximately 50% of the area on the die needed for each storage cell is effected.

Yet another advantage of the present invention is the diminishment of breakdown effect on the thin oxide layers in the device during an erase mode cycle.

Still another advantage of the present invention is that it comprises a "short-channel" device which allows denser packing on a chip.

Another advantage of the present invention is that the need for a high-cost, slow UV erase process required for UV EPROM cell arrays is virtually eliminated.

Other objects, features and advantages of the present invention will become apparent upon consideration of the following detailed description and the accompanying drawings, in which like reference designations represent like features throughout the FIGURES.

The drawings referred to in this description should be understood not to be drawn to scale except if specifically noted. Moreover, the drawings are intended to illustrate only a component of an integrated circuit fabricated in accordance with the present invention.

DETAILED DESCRIPTION OF THE INVENTION

Reference is made now, in detail, to a specific embodiment of the present invention which illustrates the best mode presently contemplated for practicing the invention. Alternative embodiments are also briefly described as applicable.

Figure 1A:
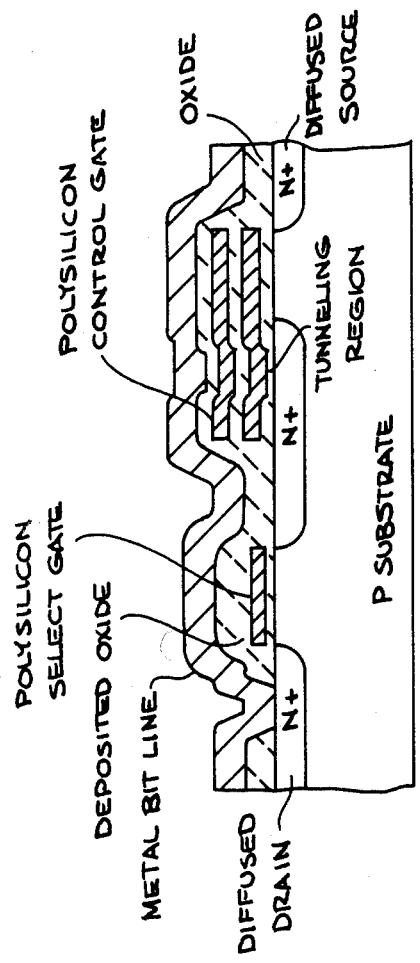
FIG. 1(a) represents the cross-section of a prior art EEPROM cell as depicted in FIG. 1.
Figure 2:
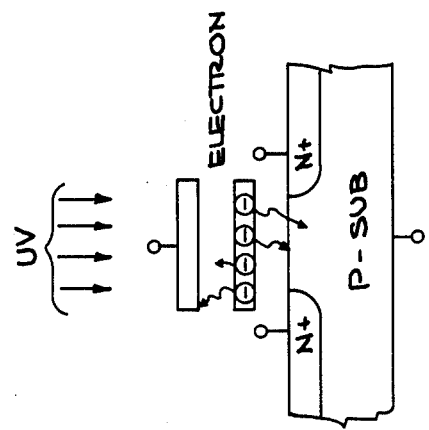
FIG. 2 represents the cross-section of a prior art UV EPROM cell during an ERASE process.
Figure 1:
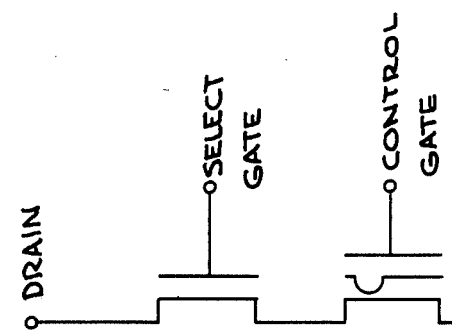
FIG. 1 is an electrical schematic diagram of a prior art EEPROM cell.
Figure 3:
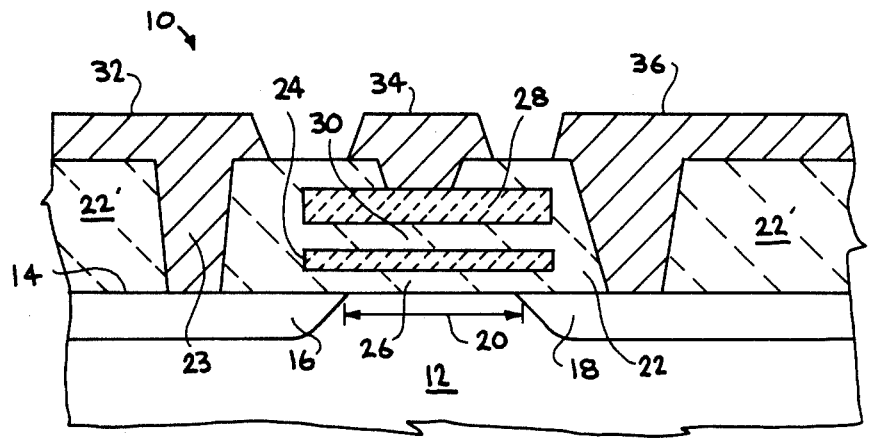
FIG. 3 is a cross-sectional drawing of the single transistor EEPROM cell according to the present invention.

In the main, FIG. 3 shows a cross-sectional view of a PROM cell transistor fabricated in a manner which allows operation in the "snap-back," or "snap-recovery," mode without causing any significant damage to the oxide layers.

It should be recognized that many publications describe the details of common techniques used in the fabrication process of integrated circuit components. See, e.g., *Semi-conductor & Integrated Circuit Fabrication Techniques*, Reston Publishing Co., Inc., copyright 1979 by the Fairchild Corporation. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in this art may call for appropriate adjustments as would be obvious to one skilled in the art.

A wafer substrate 12 having a first conductivity type, e.g., p type, is generally formed of crystalline silicon, or an epitaxially formed silicon layer. The substrate 12 in a device constructed in accordance with the present invention was doped with boron ions to a concentration of approximately $7.5 \times 10^{14}/cm^3$.

A region 16 of the substrate 12 is doped to have a second conductivity type, e.g., n+ type, adjacent to the surface 14 of the substrate 12, and forms the source region 16 of the MOSFET EEPROM cell 10.

A doped region 18 adjacent to the surtace 14, having the same second conductivity type as the source region 16, forms the drain region 18 of the cell 10.

The region of the substrate 12 lying between the source 16 and the drain 18 is a short channel 20.

In an exemplary device constructed according to the present invention, the dimensions (length×width×-depth) of the source region 16 were approximately 1.5×1.5×0.2 microns. The doping of the source region 16 was approximately $10^{22}/cm^3$. The drain dimensions were approximately 1.5×1.5×0.2 microns. The doping of the drain region 18 was approximately $10^{22}/cm^3$. The channel dimensions were approximately 1.3×1.7. Sub-micron channel lengths are contemplated as further improvements in fabrication technology occur.

Dielectric regions 22, 22', used to isolate the various regions of the integrated circuit, are superjacent to the substrate surface 14. Typically, these regions are formed of an insulator or dielectric material such as silicon dioxide, also commonly referred to as simply "oxide." These regions 22, 22' are formed to have apertures 23 formed therein such that electrical contact to the cell can be established.

Superposing the channel 20 and a portion of the source 16 and the drain 18 is a floating gate 24 used to store a charge which represents a bit of datum. Polysilicon or another semiconductive or conductive material is generally used to form the floating gate. The floating gate 24 is separated from the substrate surface 14 by a layer 26 of the oxide region 22. In the exemplary device, dimensions of the floating gate were approximately 2.9×1.3×0.25.

Superposing the floating gate 24 is a control gate 28 having like dimensions. The control gate 28 can also be fabricated from polysilicon. The control gate 28 is isolated from the floating gate 24 by another layer 30 of the oxide region 22.

Interconnection conductive regions, generally metal layers, 32, 34, 36, electrically couple the source 16, control gate 28, and drain 18, respectively, in accordance with the operational requirements of the cell 10.

The programming mechanisms involved, viz., the writing and erasing of an electrical charge representing a data bit from the floating gate 24, are channel hot-carrier techniques.

Figures 4A, 4B:
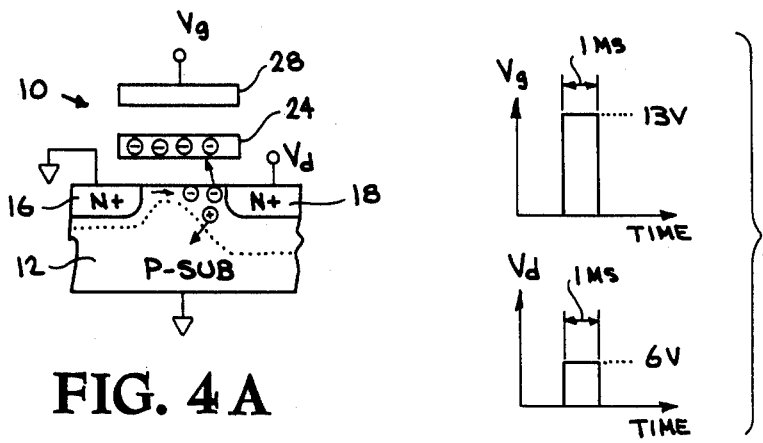
FIG. 4(a) is a cross-sectional drawing of the present invention as shown in FIG. 3, depicting exemplary carrier action during the WRITE mode of operation.
FIG. 4(b) shows graphical representations of the gate and drain bias voltages used during the WRITE mode as shown in FIG. 4(a).

Referring to FIG. 4(a), the WRITE mode, viz., the writing of a data bit into the cell, is accomplished through channel hot-electron injection onto the floating gate. In this regard, the present invention's approach to writing data into a cell is similar to that used for prior art devices. Briefly, a potential difference is created between the drain and gate as shown in FIG. 4(b), turning the device 10 on as per the bias voltages, $V_g$ and $V_d$. Hot-electrons in the channel region 20 can surmount the energy barrier existing at the substrate surface 14 between the substrate 12 and the thin oxide layer 26. Once in the oxide layer 26, these electrons are pulled to the floating gate 24, driven by the potential difference electric field across the oxide layer 26. The floating gate 24, being fabricated of a dielectric material such as polysilicon, will trap these electrons which causes an increase of the threshold voltage, $V_{th}$ (gate-to-source voltage required to turn the device on). The floating gate 24 thereby stores charge, i.e., a data bit, for an extremely long period.

UV or select transistor forced ERASE techniques of prior art devices draw the electrons from the floating gate 24. To overcome the aforesaid disadvantages of the prior art, the present invention achieves an ERASED state by hot-hole injection onto the floating gate 24. This will neutralize the negative charges stored there. This operation will, therefore, shift the $V_{th}$ back to the value which existed prior to the data holding state.

Figures 5A, 5B:
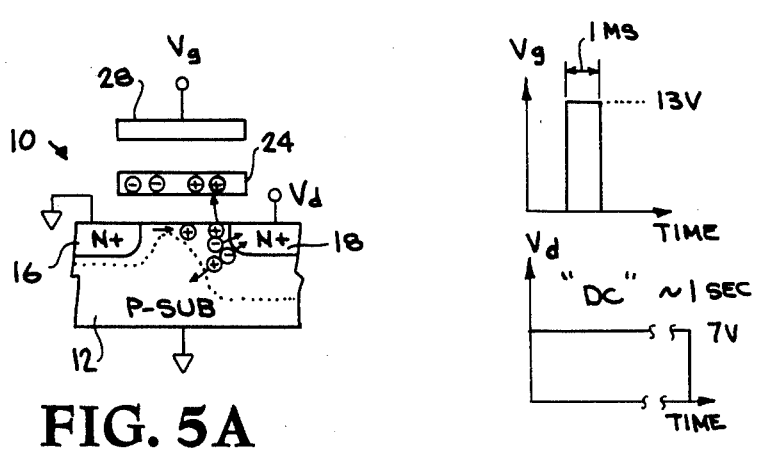
FIG. 5(a) is a cross-sectional drawing of the present invention as shown in FIG. 3, depicting exemplary carrier action during the ERASE mode of operation.
FIG. 5(b) shows graphical representations of the gate and drain bias voltages used during the ERASE mode as shown in FIG. 5(a).

The ERASE mode, as depicted in FIGS. 5(a) and 5(b), is achieved by the device 10 design to operate in an essentially nondestructive mode known in the art as the "snap" or "snapback" mode. This mode provides the aforementioned operational advantages over prior art devices.

To erase a cell, the drain bias voltage, $V_d$, is set to a steady-state level for approximately 1 second, maintaining the device 10 in an OFF condition. In an exemplary device, Vd was set to approximately 7 volts. The high drain-to-source potential, Vds, will create a large field about the drain region 18. A relatively high current flow then will exist from the source 16 to the drain 18.

Figure 7:
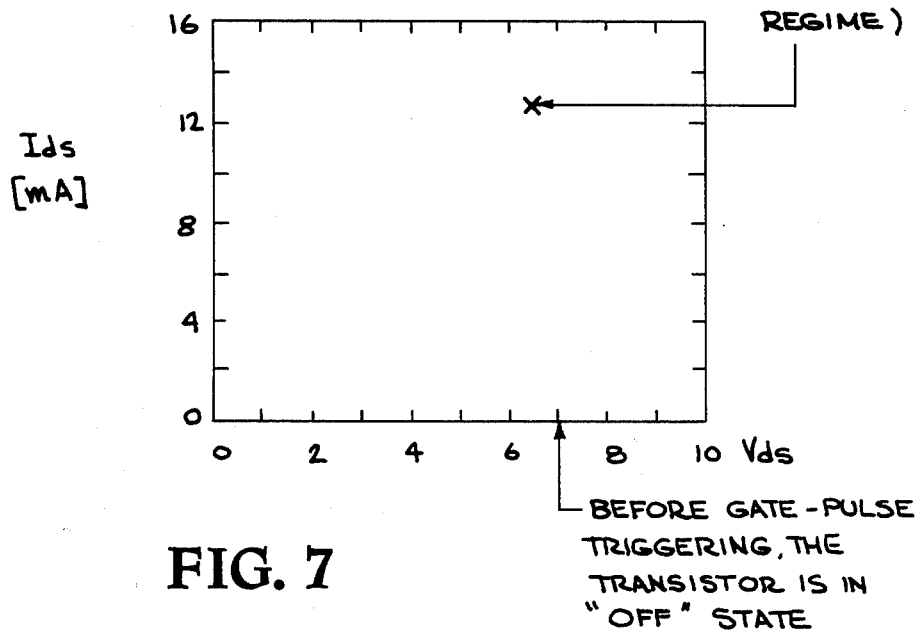
FIG. 7 shows a graphical representation of the drain source current versus the biasing voltage in the snap-back mode.

A pulse, Vg, of approximately 13 volts, of approximately 1 millisecond duration, is applied to the control gate 28 during this period. The relatively short source-to-drain channel dimension encourages a high source-to-drain current flow. The substrate therefore experiences a potential drop and the source-to-substrate junction becomes forward biased. Thus, after the gate-pulse triggering, the device 10 is in the positive feedback mode. The drain current is maintained at a high level, as shown in FIG. 7.

Biasing the device 10 in this manner nas forced the cell into the snap-back condition. The relatively large number of holes generated by impact ionization near the drain region 18 in the channel region 20 flowing toward the source 16 transfer to the floating gate 24. Since the floating gate 24 is at a relatively low potential, it is in a favorable condition to accept the hole injection. Hence, the cell is rapidly erased.

Figure 6:
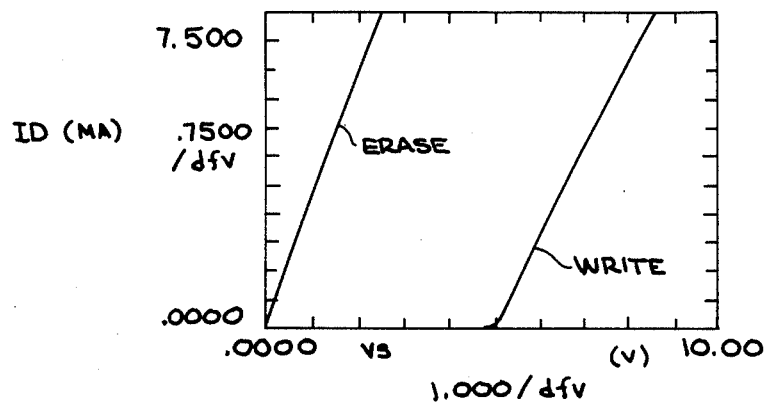
FIG. 6 shows a graphical representation of the drain current versus the gate-to-source voltage during programming and erasing modes.

A plot of the drain current versus Vgs characteristics in the linear region for the WRITE and ERASE modes using the aforesaid programming techniques is shown in FIG. 6. The exemplary device 10 exhibits a large Vth window, approximately 5 to 7 volts, between the WRITE and ERASE modes. This value is dependent upon the geometry of the cell, such as the channel length, junction depth and gate oxide thickness. Hence, the endurance characteristics of the present invention are enhanced by proper scaling in accordance with the current state of the art in integrated circuit fabrication techniques.

The biasing potentials referred to above can be generated by of a number of integrated circuit devices as are commonly known in the art.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other technologies, such as with a P-channel process development. Relative device sizes and doping concentrations are dependent upon the state of the art in fabrication technologies. The embodiment was chosen and described in order to best explain the principles of the invention and its practical application, to thereby enable others skilled in the art to understand the invention for various embodiments and with various modifications as are suited to the particular use contemplated. It is intended that the scope of the invention be defined by the claims appended hereto and their equivalents.

What is claimed is:

1. An integrated circuit memory, comprising:
    a semiconductor device for storing an electrical charge representing a data bit; and
    means for biasing said semiconductor device to operate said semiconductor device in a snap-back mode so that said data bit is erased from said semiconductor device.

2. An integrated circuit memory as set forth in claim 1, wherein said semiconductor device comprises:
    a transistor having a floating gate for storing said data bit;
    wherein said data bit is erased by hot-hole injection onto said floating gate during said snap-back mode.

3. A semiconductor integrated circuit memory component, comprising:
    a metal-oxide-semiconductor field effect transistor (MOSFET), havign a floating gate for storing an electrical charge representing a data bit; and
    mens for essentially nondestructively biasing said MOSFET
    to place said MOSFET into a snap-back mode such that hot-hole injection onto said floating gate neutralizes said electrical charge, whereby said data bit is erased.

4. In an electrically erasable programmable read only memory integrated circuit device, having means for producing a plurality of reference potentials, an improved memory cell comprising a substrate having a first conductivity type, a drain region in said substrate having a second conductivity type, a channel region between said source region and said drain region, a dielectric layer superposing said substrate, a first gate region in said dielectric layer superposing said channel region, for storing an electrical charge representing a bit of data, and a second gate region in said dielectric layer superposing and separated from said first gate region characterized in that means are provided for coupling said drain region, source region, and second gate region to said producing means and operating said cell so that said cell is biased into a snap-back condition to erase said data bit.

5. The memory cell as set forth in claim 4 wherein said first gate region accepts hot-holes from said channel region during said snap-back condition, biasing said first gate region to neutralize said electrical charge and erase said data bit.

6. The cell as set forth in claim 5, wherein said drain region is coupled to receive a first electrical potential bias from said producing means.

7. The cell as set forth in claim 6, wherein said source region is coupled to an electrical ground potential for said device.

8. The cell as set forth in claim 7, wherein said second gate region is coupled to receive a second electrical potential bias from said producing means, whereby said first and second electrical potential biases cooperate to force said cell into said snap-back condition.

9. A method for erasing an electrically erasable programmable memory cell, having a data bit storage means, comprising:
    operating said electrically erasable programmable memory cell in a snap-back mode to inject hot-holes onto said storage means.

10. A method for erasing an erasable programmable read only memory cell, having a single, floating gate, field effect transistor, comprising:
    providing an electrical bias to a source of said transistor to a biasing potential concommitant with its conductivity type;
    providing an electrical bias to a drain of said transistor to a first voltage potential;
    pulsing a control gate of said transistor, during said drain biasing, with a pulse having a second voltage potential which is greater in magnitude than said first voltage potential, such that said transistor is biased into a snap-back mode, whereby said data bit is erased from said floating gate.

11. The method as set forth in claim 10, wherein said transistor is an n channel type, said step of biasing said source further comprises:

coupling said source to a cell ground potential.

12. The method as set forth in claim 11, wherein said step of biasing said drain further comprises:

coupling said source to a first positive potential for approximately 1 second.

13. The method as set forth in claim 12, wherein said step of pulsing further comprises:

coupling siad control gate to a second positive potential of approximately twice the magnitude of said first positive potential for approximately 1 millisecond.

14. The method as set forth in claim 10, wherein said step of electrically biasing the drain comprises applying a bias voltage which is insufficient to create an avalanche breakdown.

* * * * *